US012633924B1

(12) United States Patent
Avron et al.

(10) Patent No.: US 12,633,924 B1
(45) Date of Patent: May 19, 2026

(54) MESSAGE BASED INTERCONNECT FABRIC

(71) Applicant: Amazon Technologies, Inc., Seattle, WA (US)

(72) Inventors: Itai Avron, Petah Tikva (IL); Sergey Kleyman, Ramat Gan (IL); Benny Pollak, Yad Binyamin (IL)

(73) Assignee: Amazon Technologies, Inc., Seattle, WA (US)

( * ) Notice: Subject to any disclaimer, the term of this patent is extended or adjusted under 35 U.S.C. 154(b) by 222 days.

(21) Appl. No.: 18/344,318

(22) Filed: Jun. 29, 2023

(51) Int. Cl.
*H03K 19/17736* (2020.01)
*G06F 13/40* (2006.01)

(52) U.S. Cl.
CPC ... *H03K 19/17736* (2013.01); *G06F 13/4022* (2013.01)

(58) Field of Classification Search
CPC ..................... H03K 19/17736; G06F 13/4022
See application file for complete search history.

(56) References Cited

PUBLICATIONS

Minutella et al., Exam Prep CCNA, 2006, retrieved on Jul. 11, 2025, retrieved from the Internet <URL: https://www.netcamp.in/application/ assets/img/CCNA-Exam-Prep-Guide.pdf> (Year: 2006).*

* cited by examiner

*Primary Examiner* — Tyler J Torgrimson
(74) *Attorney, Agent, or Firm* — Weaver Austin Villeneuve & Sampson LLP

(57) ABSTRACT

An interconnect fabric may comprise a plurality of interconnect routing devices (IRDs) coupled in a mesh topology via general-purpose wires that are configurable to carry different combinations of message types, and each message type may belong to a different logical channel. Each IRD may be operable to receive concurrently, from a set of input interfaces, multiple messages belonging to one or more message types. Each IRD may be operable to map the multiple messages to one or more output interfaces from a set of output interfaces based on a destination of each message. Each IRD may be further operable to send, for each of the mapped output interfaces, the messages mapped to the output interface as a combination of logical channels onto a set of general-purpose wires of the output interface, wherein each of the general-purpose wires is operable to dynamically switch between carrying messages of different message types.

20 Claims, 7 Drawing Sheets

600

AN IRD RECEIVES CONCURRENTLY, FROM A SET OF INPUT INTERFACES, MULTIPLE MESSAGES BELONGING TO ONE OR MORE MESSAGE TYPES. EACH MESSAGE TYPE MAY CORRESPOND TO A LOGICAL CHANNEL
602

THE IRD MAPS THE MULTIPLE MESSAGES TO ONE OR MORE OUTPUT INTERFACES FROM A SET OF OUTPUT INTERFACES BASED ON A DESTINATION OF EACH MESSAGE
604

THE IRD SENDS, FOR EACH OF THE MAPPED OUTPUT INTERFACES, THE MESSAGES MAPPED TO THE OUTPUT INTERFACE AS A COMBINATION OF LOGICAL CHANNELS ONTO A SET OF GENERAL-PURPOSE WIRES OF THE OUTPUT INTERFACE. EACH OF THE GENERAL-PURPOSE WIRES IS OPERABLE TO DYNAMICALLY SWITCH BETWEEN CARRYING MESSAGES OF DIFFERENT MESSAGE TYPES
606

400

| COMBINATION IDENTIFIER (ID) 402 | COMBINATION OF LOGICAL CHANNELS 404 |
|---|---|
| 0x0 | DEFAULT MODE |
| 0x1 | REQUEST + REQUEST |
| 0x2 | RESPONSE + RESPONSE |
| 0x3 | SNOOP + SNOOP |
| 0x4 | DATA + DATA |
| 0x5 | REQUEST + DATA |
| 0x6 | SNOOP + REQUEST |
| 0x7 | DATA + RESPONSE |

600

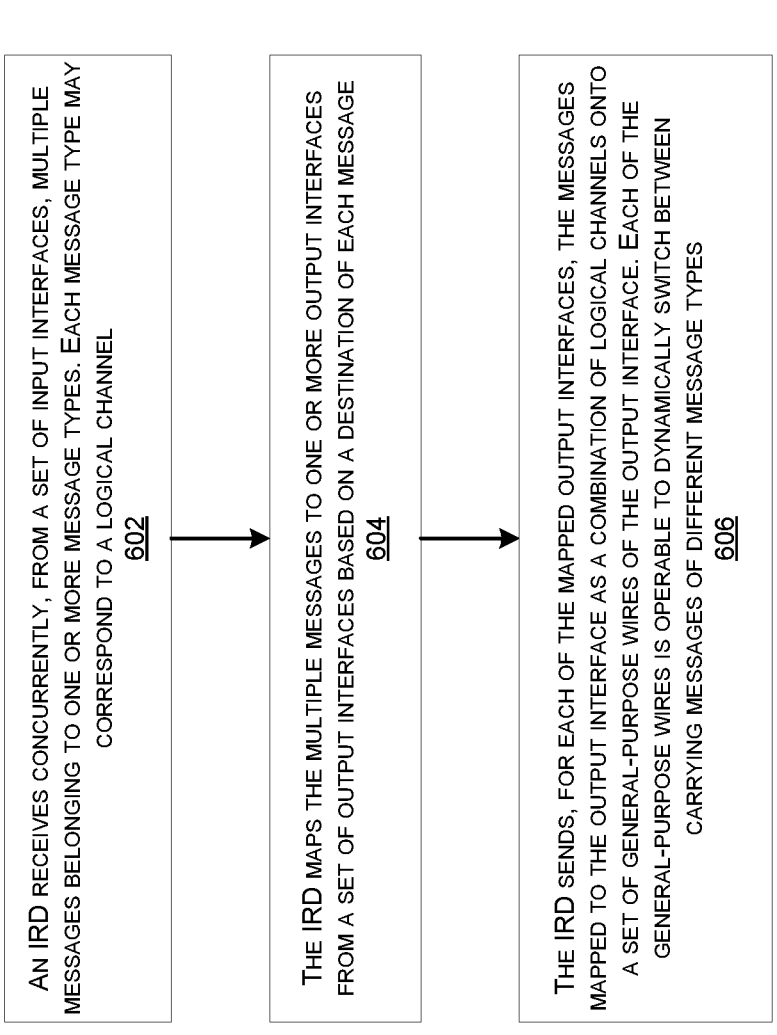

AN IRD RECEIVES CONCURRENTLY, FROM A SET OF INPUT INTERFACES, MULTIPLE MESSAGES BELONGING TO ONE OR MORE MESSAGE TYPES. EACH MESSAGE TYPE MAY CORRESPOND TO A LOGICAL CHANNEL
602

THE IRD MAPS THE MULTIPLE MESSAGES TO ONE OR MORE OUTPUT INTERFACES FROM A SET OF OUTPUT INTERFACES BASED ON A DESTINATION OF EACH MESSAGE
604

THE IRD SENDS, FOR EACH OF THE MAPPED OUTPUT INTERFACES, THE MESSAGES MAPPED TO THE OUTPUT INTERFACE AS A COMBINATION OF LOGICAL CHANNELS ONTO A SET OF GENERAL-PURPOSE WIRES OF THE OUTPUT INTERFACE. EACH OF THE GENERAL-PURPOSE WIRES IS OPERABLE TO DYNAMICALLY SWITCH BETWEEN CARRYING MESSAGES OF DIFFERENT MESSAGE TYPES
606

FIG. 6

MESSAGE BASED INTERCONNECT FABRIC

BACKGROUND

Large integrated circuit (IC) devices may comprise multiple components that may communicate via an interconnect fabric. Some example components may include processors, graphics processing units (GPUs), neural network accelerators, memory controllers, input/output (I/O) controllers, etc. The interconnect fabric may facilitate different types of transactions between the components, which may be performed by exchanging messages based on an interconnect protocol.

BRIEF DESCRIPTION OF THE DRAWINGS

Various embodiments in accordance with the present disclosure will be described with reference to the drawings, in which:

FIG. 6 illustrates an example flow chart for a method performed by an IRD, in accordance with some embodiments.

DETAILED DESCRIPTION

Figure 1:
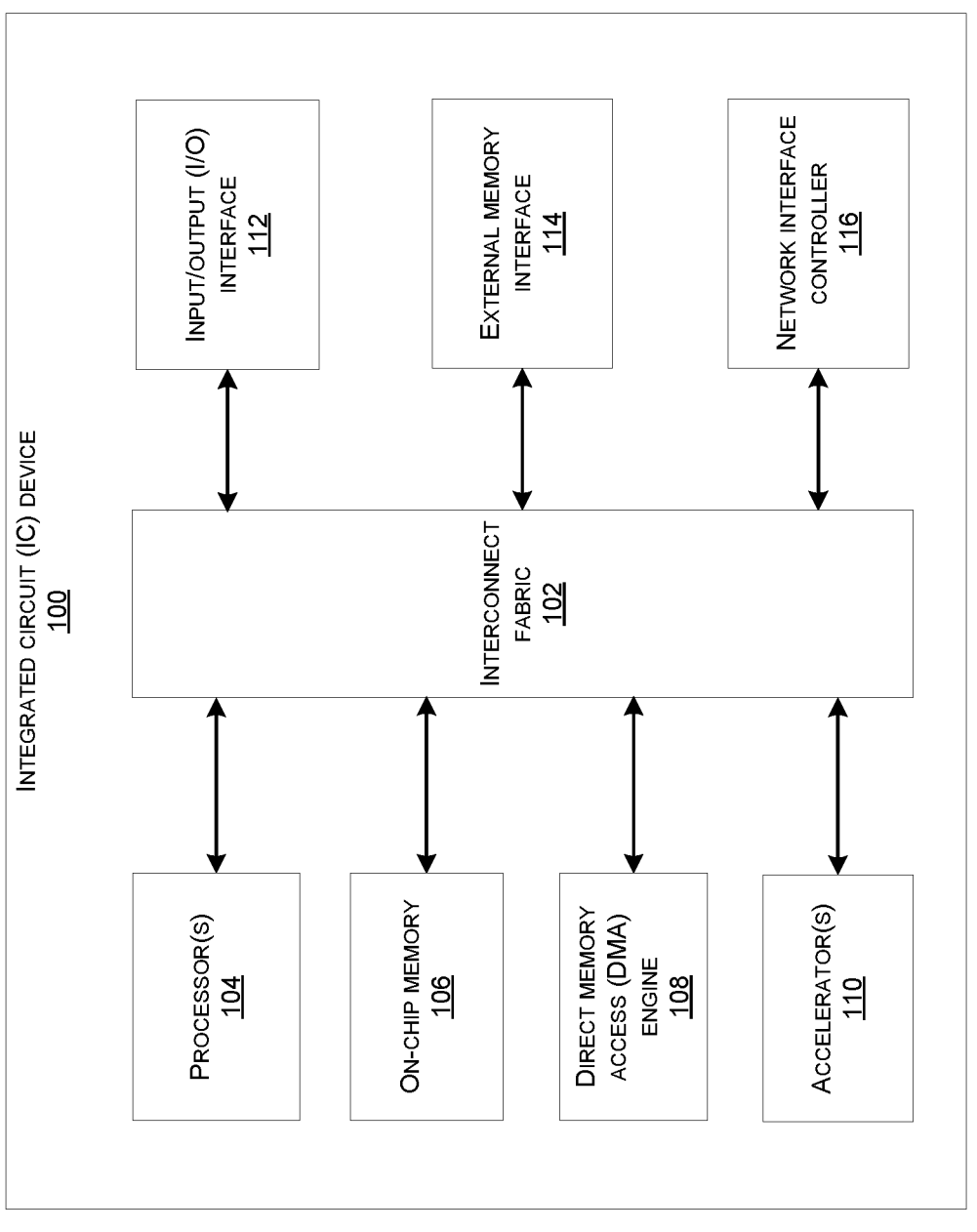
FIG. 1 illustrates an example block diagram for an IC device comprising a plurality of components configurated to communicate via an interconnect fabric.

Modern day applications, such as, high performance computing (HPC), artificial intelligence (AI), networking, computer vision, gaming, etc., rely on computing systems with large integrated circuit (IC) devices comprising different components that may communicate with one another via one or more interconnect fabrics. For example, some computing systems may include system-on-chips (SoCs) comprising CPUs, graphics processing units (GPUs), neural network accelerators, on-chip memory, external memory controllers, input/output (I/O) subsystems, direct memory access (DMA) engines, etc., that can communicate via one or more interconnect fabrics based on suitable protocols, such as, Coherent Hub Interface (CHI), Advanced eXtensible Interface (AXI), AXI Coherency Extension (ACE), or Credited extensible Stream (CXS), among others.

An interconnect fabric may include routing devices (also called switches) that can be connected in a suitable topology, e.g., ring, mesh, cross bar, etc. In some implementations, routing devices can be connected horizontally and vertically to form a two-dimensional mesh using wires that may be able to carry different messages based on the interconnect protocol to facilitate various transactions between the components. In some implementations, each message type may belong to a different logical channel with dedicated wires/buses for each logical channel. For example, for the interconnect fabric based on the CHI protocol, the message types may include request (REQ), response (RSP), snoop (SNP), and data (DAT), in which REQ messages are transmitted on a REQ bus, RSP messages are transmitted on a RSP bus, SNP messages are transmitted on a SNP bus, and DAT messages are transmitted on a DAT bus.

Generally, to carry different message types in each direction of communication between any two routing devices, the bus width is doubled. Thus, a large number of wires may be needed to support all the logical channels between the routing devices based on the interconnect protocol, which can consume a considerable amount of area on the IC device, and pose physical design challenges to meet the chip timings. As an example, in some implementations, area for a large interconnect fabric in a large IC device may take up to 10-20% of the total chip area, and may require manual fine tuning during place-and-route of the chip to achieve low latency that may be critical to meet performance inside the interconnect fabric.

In most cases, the wires of the interconnect fabric that take up the huge amount of area on an IC device may not be utilized efficiently. Generally, not every logical channel is used in every cycle. In other words, not every cycle will have REQ, RSP, SNP, and DAT messages transmitting across the bus at the same time. Hence, most cycles will have some wires that are not being utilized. In other instances, there can be multiple messages of the same type pending, but the bus may not be able to carry more than one of each type of message on the bus. For example, an interconnect fabric configured in a two-dimensional mesh topology may receive multiple request (REQ) messages simultaneously from several directions. However, if those REQ messages are targeted in the same direction, it can cause back pressure and affect the system performance because the REQ bus may support transfer of one REQ message at a time. Some implementations may add extra buses to support higher bandwidth (e.g., 2 request channels, or 2 data channels) through the interconnect fabric, but doing so will further increase the chip area and further exacerbate the physical design challenges.

Techniques described herein can be used to efficiently utilize the interconnect resources to provide higher bandwidth for a given set of interconnect wires, or to reduce the chip area by reducing the total number of interconnect wires for a given bandwidth. In some embodiments, the interconnect fabric may comprise routing devices that are coupled in a mesh topology using general-purpose wires, which can be configured to carry different combinations of message types. The general-purpose wires are not dedicated for any specific message type, and each wire can dynamically change from carrying one type of message to a different type of message from cycle to cycle. Each routing device may receive multiple messages concurrently from different directions in the mesh, and may be operable to transmit a combination of logical channels on a set of general-purpose wires in one or more directions based on a mapping. By using general-purpose wires, the combination of logical channels transmitted in the same cycle can include multiple messages of the same type, as well as multiple messages of different types. Thus, the interconnect fabric can be utilized efficiently by configuring the general-purpose wires dynamically to carry multiple logical channels between the routing devices, which can improve system performance by increasing the bandwidth through the interconnect fabric as well as reduce the overall congestion.

In some interconnect fabrics, certain dedicated buses can be used infrequently, and thus can be idle intermittently during normal operation. In such cases, the total number of general-purpose wires replacing the dedicated buses can be reduced, and the reduced set of wires can be configured to carry dynamic combinations of logical channels per cycle such that the otherwise idle cycles can be used to transfer other types of messages. Thus, the interconnect area required for the routing can be reduced, which can reduce the chip area, as well as improve the chip timings, which otherwise may require special routing of the signals to achieve the desired latency.

In some implementations, a combination identifier (ID) can be generated to indicate which combination of logical channels that the messages mapped to a given direction belong to, which can vary based on the message types being received by the routing device from different directions, and the available wires in that cycle in the output direction. In some examples, mapping the multiple messages to a given direction can be based on an attribute associated with each message that indicates a priority level for routing the message. For example, a certain logical channel may have a higher priority over other logical channels for mapping to an output direction. In some examples, the attribute can be used to map the multiple messages in a way that reduces local congestion in the interconnect fabric. Thus, multiple logical channels of the same or different message types can be carried in the same cycle without compromising the chip area, or performance.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an example block diagram for an IC device 100 comprising a plurality of components configurated to communicate via an interconnect fabric. In some examples, the IC device 100 can be implemented as a system-on-a-chip (SoC). The IC device 100 can be part of a computing device that can be used for different applications.

The example IC device 100 may include one or more processors 104, an on-chip memory 106, a direct memory access (DMA) engine 108, one or more accelerators 110, an input/output (I/O) interface 112, an external memory interface 114, and a network interface controller 116 that can be configured to communicate via an interconnect fabric 102. The one or more processors 104 may include processor cores, processor clusters, a CPU complex, GPUs, microcontrollers, etc. The on-chip memory 106 may include SRAMs, ROMs, registers, buffers, etc. The DMA engine 108 may be used to perform data transfers between different memories without involving the processors 104. The I/O interface 112 may include hubs, bridges, ports, or other suitable interfaces to connect with other interconnects, buses, I/O subsystems, I/O devices, or peripherals. For example, the I/O interface 112 may be used to interface with other components via AXI, APB, or PCIe buses. The accelerators 110 may include neural network accelerators, cryptographic accelerators, etc. The external memory interface 114 may include memory controllers and other suitable interfaces to communicate with an external memory, e.g., DRAM, SDRAM, high bandwidth memory (HBM), solid state drive (SSD), etc. The network interface controller 116 may be used to provide a network interface to communicate over a network with a remote device.

The interconnect fabric 102 may be configured to provide connectivity between different components of the IC device 100. The interconnect fabric 102 may include routing devices or switches that can be configured in a mesh, cross-bar, ring, or another suitable topology based on the system specification. The interconnect fabric 102 may also include ports, buffers, queues, and other logic to facilitate communication between the different components. In some implementations, the interconnect fabric 102 may also include logic to maintain coherency between different processors for the shared data. An example interconnect fabric 102 may be configured in a mesh topology, as described with reference to FIG. 2.

Figure 2:
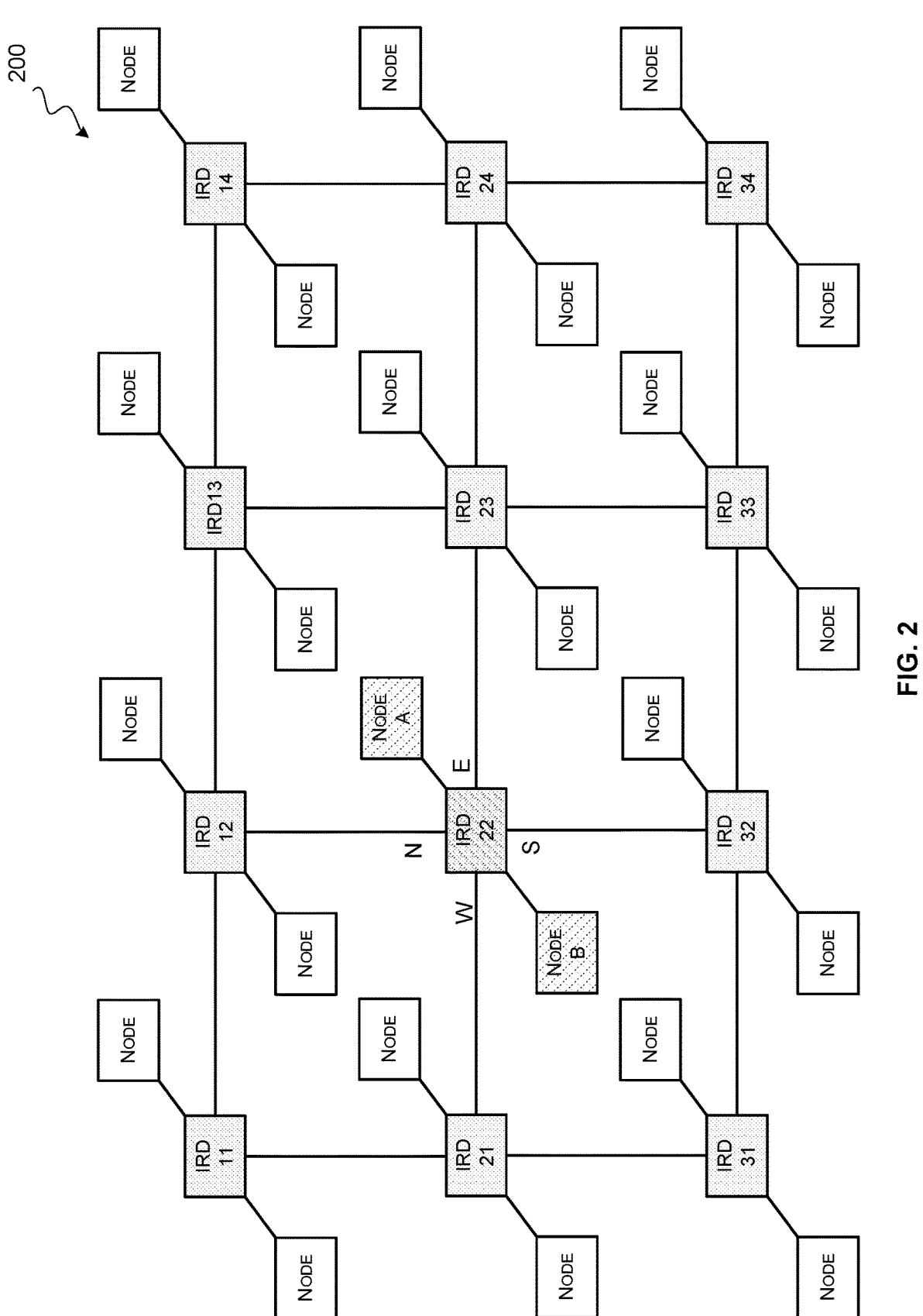
FIG. 2 illustrates an example of an interconnect fabric configured as a two-dimensional mesh.

FIG. 2 illustrates an example of an interconnect fabric 200 configured as a 4×3 mesh. The interconnect fabric 200 can be an example of the interconnect fabric 102 in FIG. 1.

The interconnect fabric 200 may include a plurality of interconnect routing devices (IRDs) that are connected horizontally and vertically via a set of general-purpose wires to form a 2-dimensional mesh. As shown in FIG. 2, the interconnect fabric 200 may include 12 IRDs configured into 4 columns and 3 rows, e.g., IRDs 11, 12, 13, and 14 in a first row, IRDs 21, 22, 23, and 24 in a second row, and IRDs 31, 32, 33, and 34 in a third row. Each IRD may include ports to connect different nodes. For example, as shown in FIG. 2, each IRD 11-14, 21-24, and 31-34 of the interconnect fabric 200 may include 2 node ports (or device ports) connected to corresponding nodes (or IC components). For example, the IRD 22 is connected to node A and node B via two node ports. Each IRD may also include up to 4 ports to connect to neighboring IRDs in other directions. For example, the IRD 22 is connected to the IRD 12 in the North (N) direction, IRD 21 in the West (W) direction, IRD 23 in the East (E) direction, and the IRD 32 in the South(S) direction, via corresponding ports.

The nodes connected to each IRD in FIG. 2 may include devices external to the interconnect fabric 200, or internal components of the interconnect fabric 200. For example, the external devices connected to different nodes may include components of the IC device 100, e.g., processors, memory controllers, etc. The internal components of the interconnect fabric 200 may include home nodes, or interfaces to connect with external devices via different interconnects or buses. Each node may operate as a requester node to generate a request for a transaction with another node, or as a target/destination node to receive the transaction request and generate a response. The transactions may include write or read accesses to a memory.

In some implementations, the interconnect fabric 200 may be based on a CHI protocol, and the nodes connected to the IRDs 11-14, 21-24, and 31-34 may include CHI-compliant devices. For example, the IRDs 11-14, 21-24, and 31-34 may be cross-point (XP) devices that can send request, response, snoop, and data messages in flits between the nodes connected to the given XP device, or to another XP device through the mesh. In some implementations, the interface between the IRDs may include several logical channels with dedicated wires for each logical channel. For example, each IRD may support request (REQ), response (RSP), snoop (SNP), and data (DAT) channels for transferring flits across the interconnect fabric 200 from a source node to a destination node based on the CHI protocol. Generally, the wires only carry one logical channel per cycle, and, therefore, most of the wires are not fully utilized across cycles. Thus, the wires between the IRDs across the mesh can be mostly wasted resources, which may not be all needed all the time for transferring the flits.

In some embodiments, wires in the interconnect fabric 200 can be utilized efficiently by configuring the wires to carry multiple logical channels in the same cycle corresponding to the same message type based on the interconnect protocol. Thus, the bandwidth through the interconnect fabric can be increased, which can improve system performance, as well as reduce the overall congestion. In some embodiments, the total number of wires for the logical channels can be reduced, and the reduced set of wires can be configured to carry dynamic combination of logical channels in each cycle based on a mapping. Thus, the interconnect area required for the routing can be reduced, which can reduce the chip area, as well as improve the chip timings.

Figure 3:
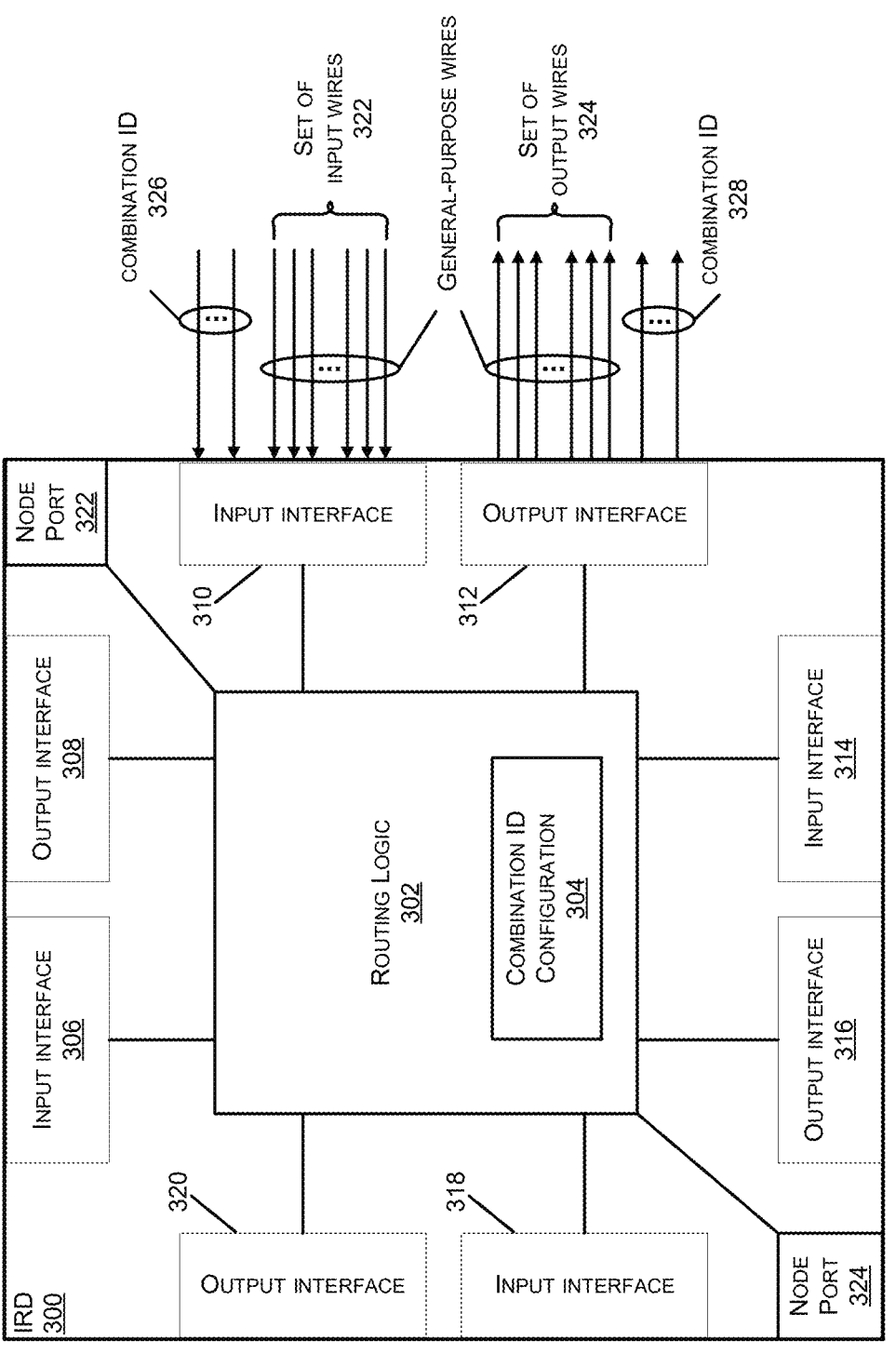
FIG. 3 illustrates an example block diagram of an interconnect routing device (IRD), in accordance with some embodiments.

FIG. 3 illustrates an example block diagram of an interconnect routing device (IRD) 300, in accordance with some embodiments. The IRD 300 can be an example of the IRDs 11-14, IRDs 21-24, and IRDs 31-34 of the interconnect fabric 200 in FIG. 2.

The IRD 300 may include routing logic 302, a node port 322, a node port 324, and a set of input interfaces and a set of output interfaces to connect with neighboring IRDs in other directions. For example, each of the input interfaces and each of the output interfaces may connect via a set of general-purpose wires to corresponding interfaces of a neighboring IRD in each direction. The node ports 322 and 324 can be the device ports that can be used to connect to different components of the IC device 100, or an internal component of the interconnect fabric 200. As an example, the IRD 300 can be the IRD 22 in FIG. 2, which may be connected to the neighboring IRDs 12, 23, 32, and 21 via corresponding input and output interfaces. The node port 322 can be used to connect with the node A of the IRD 22, and the node port 324 can be used to connect with the node B of the IRD 22. Note that the IRD 300 may include additional or different components to support the intended functionality of the interconnect fabric 200, which are not described here for ease of simplification.

The set of input interfaces may include an input interface 306, an input interface 310, an input interface 314, and an input interface 318. The set of output interfaces may include an output interface 308, an output interface 312, an output interface 316, and an output interface 320. Each input interface from the set of input interfaces, and each output interface from the set of output interfaces can be implemented using ports, multiplexers, de-multiplexers, buffers, decoders, encoders, or other suitable components based on the implementation.

As shown in FIG. 3, the input interface 310 can receive messages from a neighboring IRD (e.g., the IRD 23) via a set of input wires 322, and the output interface 312 can send messages to the neighboring IRD (e.g., the IRD 23) via a set of output wires 324. The set of input wires 322 and the set of output wires 324 can be general-purpose wires, and each general-purpose wire can be configured to carry a message type based on the interconnect protocol. Similarly, each of the input interfaces 306, 314, and 318 can receive messages from the IRD 12, 32, and 21, respectively, via a corresponding set of input wires, and each of the output interfaces 308, 316, and 320 can send messages to the IRD 12, 32, and 21, respectively, via a corresponding set of output wires, which are not shown in FIG. 3.

In some embodiments, the total number of general-purpose wires corresponding to the logical channels can be reduced, and the reduced set of wires can be configured to carry dynamic combinations of logical channels per cycle. Thus, the number of general-purpose wires in each set of general-purpose wires corresponding to each of the input interfaces and the output interfaces can be smaller than having dedicated wires for each logical channel, which can reduce the interconnect area required for the routing, and improve the chip timings. For example, instead of having dedicated wires for each of REQ, SNP, RSP, and DAT input and output channels, a fewer number of general-purpose wires can be implemented because all four types of messages will not be transferred concurrently in each cycle.

The routing logic 302 may be operable to concurrently receive multiple messages from the set of input interfaces 306, 310, 314, and 318 based on the interconnect protocol. The multiple messages can include different message types, and each message type may belong to a different logical channel, e.g., REQ, SNP, RSP, or DAT for the CHI protocol. The routing logic 302 may include the logic to support the routing functionality provided by the IRD 300 based on the specification of the interconnect fabric 200. For example, the routing logic 302 may include multiplexers, de-multiplexers, selection logic, or other suitable logic to route the incoming messages to the corresponding destinations via the output interfaces 308, 312, 316, and 320. In some implementations, each message may be comprised of one or more flits or packets, and each flit or packet may include a source identifier, a destination identifier, and other suitable information associated with the message.

In some embodiments, the routing logic 302 may be operable to map the multiple messages to one or more output interfaces from the output interfaces 308, 312, 316, and 320 based on a destination of each message. The multiple messages may be mapped as a combination of logical channels on each of the one or more of the output interfaces from the output interfaces 308, 312, 316, and 320. In various embodiments, the combination of logical channels for an output interface may include logical channels of a same message type, and/or different message types. In some implementations, the routing logic 302 may be operable to map the multiple messages to one or more output interfaces from the output interfaces 308, 312, 316, and 320 based on the number of available wires in the current cycle for each output interface. For example, wires that are not needed for a certain message type in a given cycle can be utilized to carry other logical channels in that cycle. Thus, multiple logical channels of the same or different message types can be carried in the same cycle without compromising the chip area, or performance.

In some implementations, the routing logic 302 may map the multiple messages to one or more output interfaces based on an attribute associated with each message. The attribute can be part of the message (e.g., a field in the packet or flit), pre-defined, or dynamically programmed. In some examples, the attribute may indicate a priority level for routing that message through the interconnect fabric 200. A high priority level may indicate that this message should get higher priority over other messages, and a low priority level may indicate that this message should get lower priority over other messages, for routing to the destination node. For example, certain messages may get higher priority (e.g., messages for a specific application) over other messages for routing to their destinations, irrespective of their message types. In some examples, the attribute can be used to control congestion through the interconnect fabric 200. For example, if the receive buffers for a certain message type are getting full on a destination node, that message type may get lower priority over other message types to be routed to that destination node.

In some embodiments, the routing logic 302 may also be operable to generate a combination ID indicating which combination of logical channels that the messages mapped to an output interface belong to, based on a combination ID configuration 304. The combination ID configuration 304 may include a mapping of the combination ID corresponding to each valid combination of logical channels. For example, the combination ID may be used to specify the placement and/or ordering of each logical channel on the output interface by indicating which general-purpose wire is carrying which message type on the output interface. The routing logic 302 can send the combination ID, and the mapped messages on the corresponding output interfaces as a combination of logical channels. For example, as shown in FIG. 3, the messages can be sent on the output interface 312 via the set of output wires 324 carrying the mapped messages as the combination of logical channels. A combination ID 328 may indicate which general-purpose wire in the set of output wires 324 is carrying which message type on the output interface 312.

In some implementations, the combination ID configuration 304 may include the mappings to indicate how many logical channels of each message type are being carried on an output interface. For example, a first combination ID value for an output interface may indicate that the combination of logical channels includes two REQ channels in the cycle. A second combination ID value may indicate that there are three REQ channels in the cycle. A third combination ID value may indicate that the combination of logical channels includes a DAT channel and an RSP channel. Note that the combination ID can be generated using any suitable implementation to indicate which general-purpose wire is carrying which message type on the output interface, such that the other IRDs receiving the messages can parse the information associated with the combination ID to identify each logical channel that is present in the combination of logical channels received for each cycle.

In some implementations, when there is only one type of message present in the combination of logical channels, instead of using distinct combination ID values to identify how many of such messages are present in a cycle, the combination ID may only need to indicate what single type of message is present. The recipient can determine how many of that type of message is present by checking the respective valid bits of the messages at their expected bit location. For example, instead of using three distinct combination IDs to indicate whether the combination of logical channels includes one, two, or three REQ message(s), a single combination ID can indicate that the combination of logical channels has only REQ messages. The recipient can check the valid bit location for the REQ message at a repeated offset to determine how many REQ messages are present. More generally, the combination ID can be encoded in any suitable manner to indicate which message type is present, the number of messages for each message type, and the ordering of the messages appearing on the general-purpose wires.

In some embodiments, each input interface from the set of input interfaces may be operable to receive a combination ID indicating a combination of logical channels for a message received by the input interface. As shown in FIG. 3, a combination ID 326 may be received by the input interface 310 indicating a combination of logical channels for a message received by the input interface 310 on the set of input wires 322. For example, the combination ID 326 may be generated by the routing logic in the IRD 23 and sent to the IRD 22 to indicate which combination of logical channels are sent to IRD 22. Similarly, other combination IDs can be received from the input interfaces 306, 314, and 318 on the corresponding set of input wires coupled to the IRDs 12, 32, and 21, respectively to indicate which combination of logical channels are being received on the general-purpose wires of the respective input interfaces.

The routing logic 302 may also be operable to map the multiple messages based on the received combination ID from each input interface. For example, the routing logic 302 may identify the one or more message types of the message received by each input interface based on the corresponding received combination ID and the combination ID configuration 304. In some implementations, the routing logic 302 may map the messages to the output interface as a combination of logical channels based on the legal combinations of logical channels supported by the interconnect protocol of the interconnect fabric. Some examples of the combination IDs are shown in FIG. 4.

Figure 4:
FIG. 4 illustrates a configuration table comprising example combinations of logical channels indicated by a corresponding combination identifier (ID) based on a combination ID configuration, in accordance with some embodiments.

FIG. 4 illustrates a configuration table 400 comprising example combinations of logical channels indicated by a corresponding combination ID based on the combination ID configuration 304, in accordance with some embodiments.

In the configuration table 400, each combination ID 402 may indicate an example combination of logical channels 404. The combination ID 402 may be similar to the combination ID 328 or 326 in FIG. 3. For example, the combination ID 402 may indicate which general-purpose wire is carrying which message type on an input interface or on an output interface. As an example, the combination ID 402 with a 0×0 value may indicate a default mode in which the general-purpose wires are mapped in the same manner as if dedicated wires are used for each message type.

Referring back to the configuration table 400, the combination ID 402 with a 0×1 value may indicate that the combination of logical channels 404 includes two REQ channels. The combination ID 402 with a 0×2 value may indicate that the combination of logical channels 404 includes two RSP channels. The combination ID 402 with a 0×3 value may indicate that the combination of logical channels 404 includes two SNP channels. The combination ID 402 with a 0×4 value may indicate that the combination of logical channels 404 includes two DAT channels.

In some examples, the combination of logical channels 404 may include different message types, and at least some of the message types may use a different number of general-purpose wires. For example, the combination ID 402 with a 0×5 value may indicate that the combination of logical channels 404 includes request and data. In this case, the set of input wires or the set of output wires may carry a REQ channel and a DAT channel. The combination ID 402 with a 0×6 value may indicate that the combination of logical channels 404 includes snoop and request. In this case, the set of input wires or the set of output wires may carry a SNP channel and a REQ channel. The combination ID 402 with a 0×7 value may indicate that the combination of logical channels 404 includes data and response. In this case, the set of input wires or the set of output wires may carry a DAT channel and a RSP channel. The configuration table 400 can be extended to include mappings of the combination ID to other combinations of logical channels. It should also be noted that although FIG. 4 shows example combination IDs for combinations of two logical channels, the configuration table 400 can be extended to include combination IDs for combinations of three logical channels, four logical channels, and so on, depending on the maximum number of logical channels the bus can support (e.g., depending on the number of general-purpose wires implemented).

Figure 5:
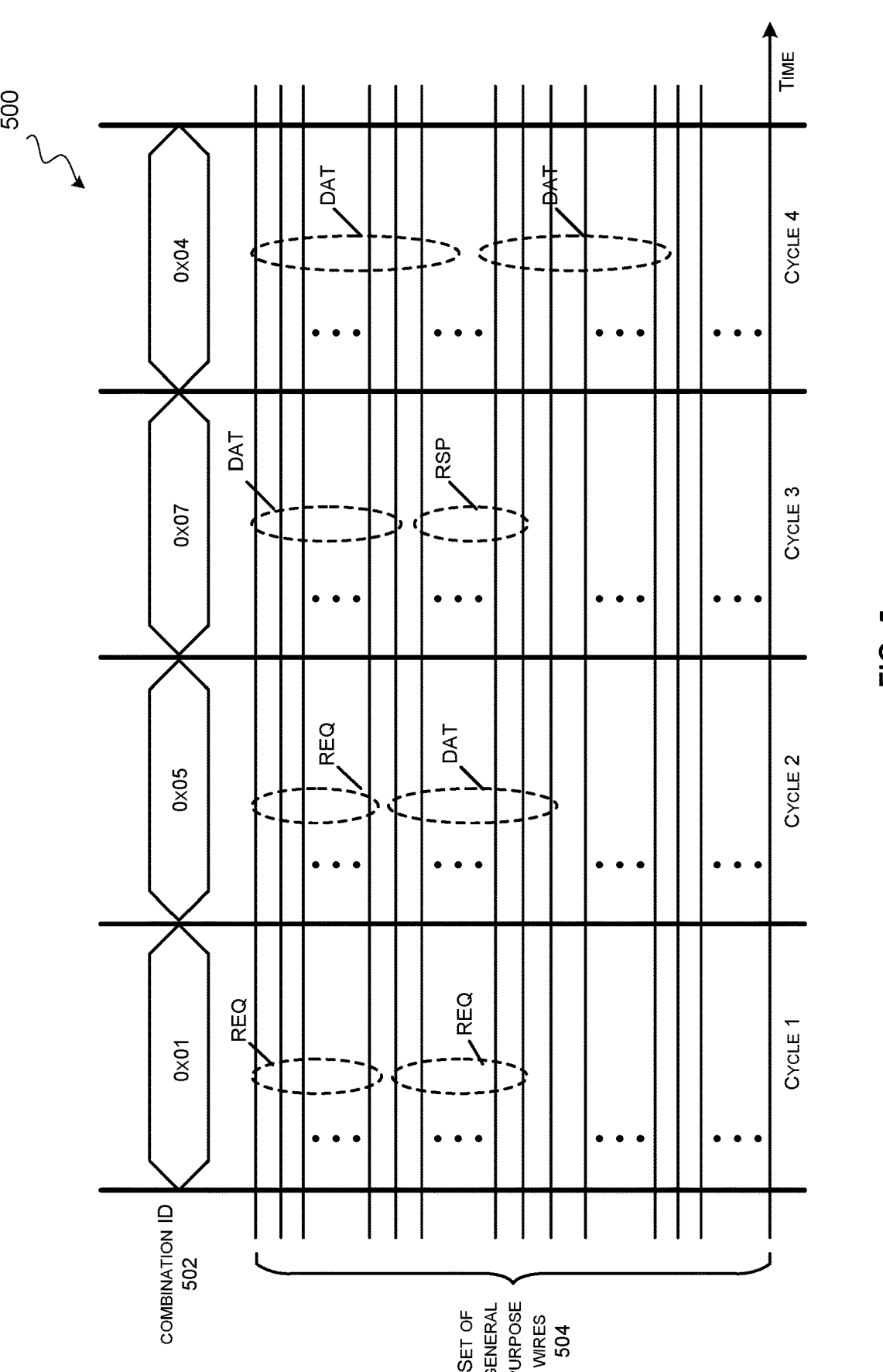
FIG. 5 illustrates an example timing diagram showing different combinations of logical channels being carried by a set of general-purpose wires across different cycles as indicated by a combination ID, according to some embodiments.

FIG. 5 illustrates an example timing diagram 500 showing different combinations of logical channels being carried by a set of general-purpose wires 504 across different cycles as indicated by a combination ID 502, according to some embodiments. As an example, the set of general-purpose wires 504 can be the set of input wires 322 and the combination ID 502 can be the combination ID 326, or the set of general-purpose wires 504 can be the set of output wires 324 and the combination ID 502 can be the combination ID 328. The combination ID 502 can be an example of the combination ID 402.

As shown in FIG. 5, in a cycle 1, the set of general-purpose wires 504 are carrying only requests channels (e.g., REQ and REQ) as indicated by the combination ID 502 having a value of 0×1. In a cycle 2, the set of general-purpose wires 504 are carrying different logical channels (e.g., REQ and DAT) as indicated by the combination ID 502 having a value of 0×5. In this case, different number of general-purpose wires from the set of general-purpose wires 504 may be used for each of the REQ and the DAT channels. In a cycle 3, the set of general-purpose wires 504 are carrying different logical channels (e.g., DAT and RSP) as indicated by the combination ID 502 having a value of 0×7. In this case also, different number of general-purpose wires from the set of general-purpose wires 504 may be used for each of the DAT and the RSP channels. In a cycle 4, the set of general-purpose wires 504 are carrying two of the same logical channel (e.g., DAT and DAT) as indicated by the combination ID 502 having a value of 0×4. However, in this case, different or same number of general-purpose wires from the set of general-purpose wires 504 may be used for each of the DAT channels based on the size of each DAT channel.

Thus, the general-purpose wires 504 can be configured to carry different combinations of message types, and each of the general-purpose wires 504 can be dynamically switched between carrying different message types, as shown across the cycles 1-4 in FIG. 5. In various embodiments, the system performance can be improved by sending multiple logical channels of the same message type to efficiently utilize the interconnect fabric, or sending multiple logical channels of different message types on a smaller number of wires, which can also reduce the interconnect area and simplify the physical design of the chip. Although the examples above show combinations of two logical channels, depending on the number of general-purpose wires being implemented, combinations of three, four, or other number of logical channels are also possible.

FIG. 6 illustrates an example flow chart 600 for a method performed by an IRD, in accordance with some embodiments. The IRD can be the IRD 300, or one of the IRDs in the interconnect fabric 200. For example, the interconnect fabric 200 may be based on the CHI protocol, and the method may be performed by the IRD 22 in FIG. 2.

In step 602, the method may include receiving concurrently, from a set of input interfaces, multiple messages belonging to one or more message types. Each message type may correspond to a logical channel. For example, the routing logic 302 in the IRD 22 may receive a first message corresponding to a REQ channel from the input interface 306, and a second message corresponding to a DAT channel from the input interface 314. The first message may be sent by the IRD 12, and the second message may be sent by the IRD 32. Both the first message and the second message may be made up of flits or packets that include the source information and the destination information of the corresponding flits or packets.

In step 604, the method may further include mapping the multiple messages to one or more output interfaces from a set of output interfaces based on a destination of each message. The routing logic 302 in the IRD 22 may map the first message and the second message to the output interface 312 based on a destination of the first message and the second message. For example, the destination information in the flits or packets belonging to the first message and the second message may indicate the IRD 23 as the destination for the REQ and DAT channels, which may be coupled to the output interface 312 of the IRD 22 via the set of output wires 324.

In step 606, the method may further include sending, for each of the mapped output interfaces, the messages mapped to the output interface as a combination of logical channels onto a set of general-purpose wires of the output interface. The routing logic 302 in the IRD 22 may send the combination of REQ and DAT channels on the set of output wires 324 of the output interface 312. As shown in FIG. 5, the set of output wires 324 can be the set of general-purpose wires 504, and each of the general-purpose wires in the set of general-purpose wires 504 can dynamically switch between carrying messages of different message types. For example, the set of general-purpose wires 504 can carry the REQ and DAT channels in cycle 2, and different combination of channels in other cycles.

The method may further include, for each of the mapped output interfaces, generating a combination ID indicating which combination of logical channels that the messages mapped to the output interface belong to, and sending the combination ID on another set of general-purpose wires of the output interface. For example, the routing logic 302 in the IRD 22 may also generate the combination ID 328 indicating the combination of REQ and DAT channels that the first message and the second message mapped to the output interface 312 belong to. The combination ID 328 can be the combination ID 502 in FIG. 5 with a value 0×05 in cycle 2, which indicates a combination of 1 REQ channel and 1 DAT channel based on the configuration table 400. Thus, multiple logical channels can be sent between the IRDs by dynamically configuring the set of general-purpose wires, which can reduce the number of wires in the interconnect fabric, thus, requiring less chip area.

The method may further include receiving, for each of the input interfaces, a combination ID indicating a combination of logical channels for a message received by the input interface. For example, the input interface 306 may also receive a combination ID (similar to the combination ID 326) indicating a combination of logical channels for the first message, and the input interface 314 may also receive a combination ID (similar to the combination ID 326) indicating a combination of logical channels for the second message. In this example, the first message and the second message only correspond to single logical channels, therefore, the combination IDs received by the input interfaces 306 and 314 may have a 0×0 value indicating no combination of logical channels. The mapping of the multiple messages by the routing logic 302 may be further based on the received combination IDs from the input interfaces 306 and 314. In some examples, mapping of the multiple messages by the routing logic 302 may also be based on an attribute associated with each message of the multiple messages that indicates a priority level for routing the message.

Thus, by configuring the general-purpose wires in an interconnect fabric to carry different combinations of message types belonging to different logical channels the total number of interconnect wires in the IC device can be reduced, and a higher bandwidth can be achieved. Furthermore, reducing the total number of interconnect wires can reduce the interconnect area, which can reduce the overall chip area, resulting in better chip timings and improved system performance.

Figure 7:
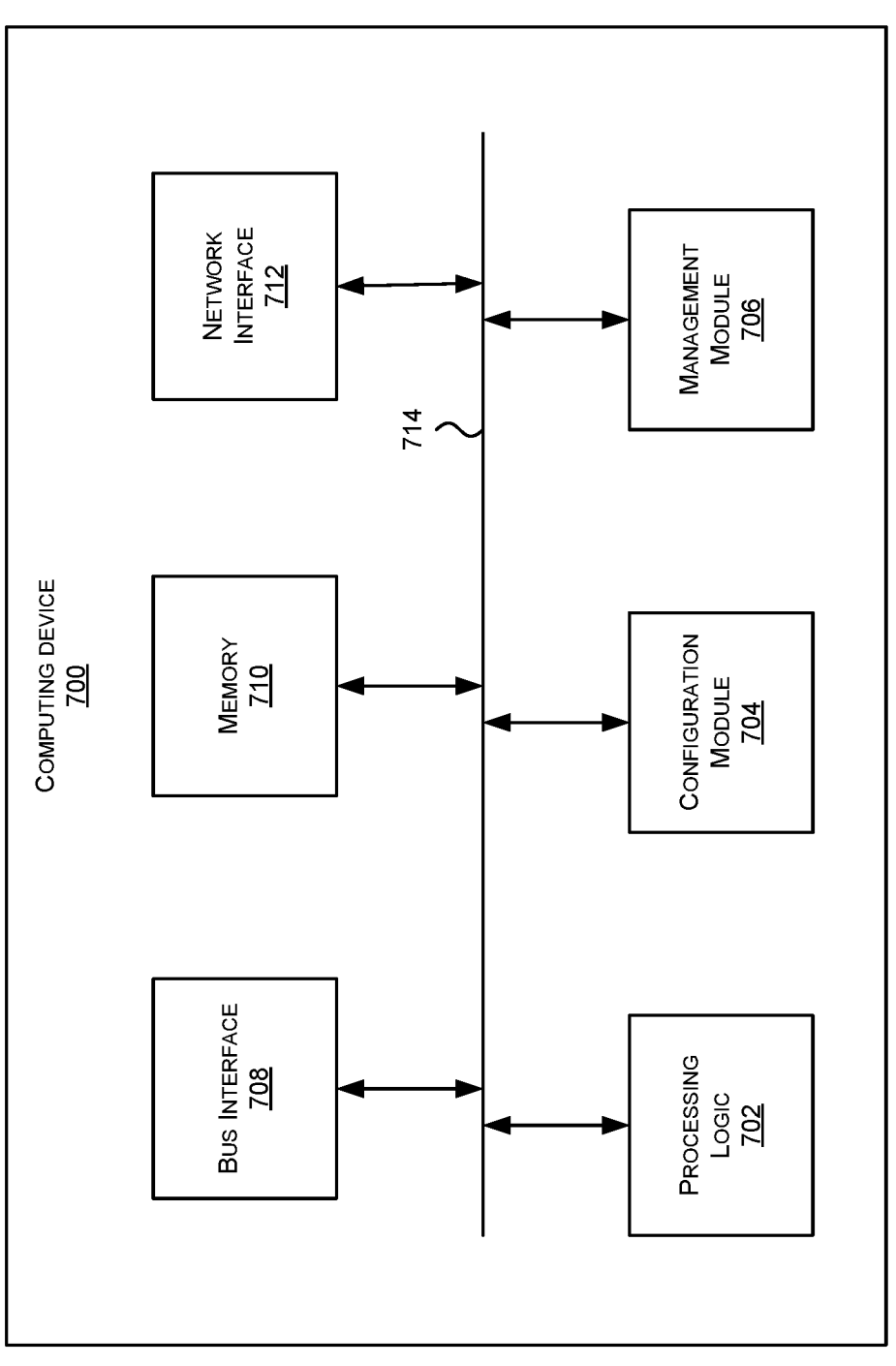
FIG. 7 illustrates an example of a computing device, according to certain aspects of the disclosure.

FIG. 7 illustrates an example of a computing device 700. Functionality and/or several components of the computing device 700 may be used without limitation with other embodiments disclosed elsewhere in this disclosure, without limitations. For example, the computing device 700 can be an example of the IC device 100 in FIG. 1. As referred to herein, a "packet" may refer to a variable or fixed unit of data. In some instances, a packet may include a packet header and a packet payload. The packet header may include information associated with the packet, such as the source, destination, length, protocol, routing labels, error correction information, etc. In certain implementations, one packet header may indicate information associated with a series of packets, such as a burst transaction.

In one example, the computing device 700 may include processing logic 702, a configuration module 704, a management module 706, a bus interface module 708, memory 710, and a network interface module 712. These modules may be hardware modules, software modules, or a combination of hardware and software. In certain instances, modules may be interchangeably used with components or engines, without deviating from the scope of the disclosure. The computing device 700 may include additional modules, not illustrated here. In some implementations, the computing device 700 may include fewer modules. In some implementations, one or more of the modules may be combined into one module. One or more of the modules may be in communication with each other over a communication channel 714. The communication channel 714 may include one or more busses, meshes, matrices, fabrics, a combination of these communication channels, or some other suitable communication channel.

The processing logic 702 may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 702 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 702 may be stored on a computer-readable storage medium, for example, in the form of a computer program. The computer-readable storage medium may be non-transitory. In some cases, the computer-readable medium may be part of the memory 710.

The memory 710 may include either volatile or non-volatile, or both volatile and non-volatile types of memory. The memory 710 may, for example, include random access memory (RAM), read only memory (ROM), Electrically Erasable Programmable Read-Only Memory (EEPROM), flash memory, and/or some other suitable storage media. In some cases, some or all of the memory 710 may be internal to the computing device 700, while in other cases some or all of the memory may be external to the computing device 700. The memory 710 may store an operating system comprising executable instructions that, when executed by the processing logic 702, provides the execution environment for executing instructions providing networking functionality for the computing device 700. The memory may also store and maintain several data structures and routing tables for facilitating the functionality of the computing device 700.

In some implementations, the configuration module 704 may include one or more configuration registers. Configuration registers may control the operations of the computing device 700. In some implementations, one or more bits in the configuration register can represent certain capabilities of the computing device 700. Configuration registers may be programmed by instructions executing in the processing logic 702, and/or by an external entity, such as a host device, an operating system executing on a host device, and/or a remote device. The configuration module 704 may further include hardware and/or software that control the operations of the computing device 700.

In some implementations, the management module 706 may be configured to manage different components of the computing device 700. In some cases, the management module 706 may configure one or more bits in one or more configuration registers at power up, to enable or disable certain capabilities of the computing device 700. In certain implementations, the management module 706 may use processing resources from the processing logic 702. In other implementations, the management module 706 may have processing logic similar to the processing logic 702, but segmented away or implemented on a different power plane than the processing logic 702.

The bus interface module 708 may enable communication with external entities, such as a host device and/or other components in a computing system, over an external communication medium. The bus interface module 708 may include a physical interface for connecting to a cable, socket, port, or other connection to the external communication medium. The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 700 may include multiple bus interface modules for communicating with multiple external entities. These multiple bus interface modules may implement the same local bus protocol, different local bus protocols, or a combination of the same and different bus protocols.

The network interface module 712 may include hardware and/or software for communicating with a network. This network interface module 712 may, for example, include physical connectors or physical ports for wired connection to a network, and/or antennas for wireless communication to a network. The network interface module 712 may further include hardware and/or software configured to implement a network protocol stack. The network interface module 712 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 700 may include multiple network interface modules, each configured to communicate with a different network. For example, in these implementations, the computing device 700 may include a network interface module for communicating with a wired Ethernet network, a wireless 802.11 network, a cellular network, an Infiniband network, etc.

The various components and modules of the computing device 700, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 7, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An interconnect routing device (IRD), comprising:
a set of input interfaces;
a set of output interfaces; and
routing logic operable to:
  concurrently receive, from the set of input interfaces, multiple messages belonging to different message types of an interconnect protocol, wherein each message type corresponds to a logical channel;
  map the multiple messages to one or more output interfaces in the set of output interfaces based on a destination of each message and a number of general-purpose wires available on each output interface; and
  for each of the mapped output interfaces, concurrently transmit messages mapped to the output interface as a combination of logical channels on a set of general-purpose wires of the output interface, generate an output combination identifier (ID) identifying which combination of logical channels and corresponding message types that the concurrently transmitted messages belong to, and transmit the output combination ID on the output interface with the concurrently transmitted messages, wherein each of the general-purpose wires is operable to dynamically switch between carrying messages of different message types, and each output interface is operable to dynamically switch between carrying different combinations of logical channels.

2. The IRD of claim 1, wherein the routing logic is further operable to transmit the output combination ID on another set of general-purpose wires of the output interface.

3. The IRD of claim 1, wherein the combination of logical channels for an output interface in a given cycle includes multiple logical channels of a same message type to concurrently transmit multiple messages of the same message type on that output interface.

4. The IRD of claim 1, wherein the combination of logical channels for an output interface in a given cycle includes multiple logical channels of different message types to concurrently transmit multiple messages of different message types on that output interface.

5. The IRD of claim 1, wherein each input interface is operable to receive an input combination ID identifying which combination of logical channels that messages being concurrently received by the input interface belong to.

6. The IRD of claim 5, wherein the routing logic is further operable to map the multiple messages to the one or more output interfaces based on the received input combination ID from each input interface.

7. The IRD of claim 1, wherein the routing logic is further operable to map the multiple messages to the one or more output interfaces based on an attribute associated with each message of the multiple messages that indicates a priority level for routing the message.

8. The IRD of claim 1, wherein the message types adhere to a coherent hub interface (CHI) protocol.

9. The IRD of claim 1, wherein the set of input interfaces includes a first input interface coupled to a first adjacent IRD, and a second input interface coupled to a second adjacent IRD, and wherein the set of output interfaces includes a first output interface coupled to a third adjacent IRD.

10. The IRD of claim 9, wherein the routing logic is operable to:

concurrently receive a first message corresponding to a first logical channel from the first input interface, and a second message corresponding to the first logical channel from the second input interface; and concurrently transmit, on the set of general-purpose wires of the first output interface, the first message and the second message with a first combination identifier (ID) indicating multiple messages corresponding to the first logical channel are being concurrently transmitted.

11. The IRD of claim 10, wherein the routing logic is operable to:

concurrently receive a third message corresponding to the first logical channel from the first input interface, and a fourth message corresponding to a second logical channel from the second input interface; and concurrently transmit, on the set of general-purpose wires of the first output interface, the third message and the fourth message with a second combination ID, the second combination ID being different than the first combination ID.

12. The IRD of claim 11, wherein the first combination ID and the second combination ID are stored in a configuration table.

13. The IRD of claim 11, wherein the first logic channel and the second logical channel are different logical channels in a set of logical channels that includes a request channel, a response channel, a snoop channel, and a data channel.

14. The IRD of claim 1, wherein the routing logic has a default configuration that allocates, from the general-purpose wires of an output interface, specific wires dedicated to each of the different message types in the default configuration.

15. The IRD of claim 14, wherein the default configuration supports concurrently transmitting up to one message of each message type on the output interface in a given cycle.

16. The IRD of claim 14, wherein the messages are transmitted in the default configuration with a default combination identifier to indicate that each of the different message types have been allocated with the specific wires on the output interface.

17. The IRD of claim 1, further comprising one or more device ports each coupled to an integrated circuit component of a system-on-chip.

18. The IRD of claim 1, wherein at least two of the message types use a different number of general-purpose wires from each other.

19. The IRD of claim 1, wherein at least two of the message types use a same number of general-purpose wires.

20. The IRD of claim 1, wherein the output combination ID indicates an ordering of the logical channels on the set of general-purpose wires for the messages being concurrently transmitted on the output interface.

* * * * *